(12) United States Patent
Kim et al.

(10) Patent No.: US 12,655,522 B2
(45) Date of Patent: Jun. 16, 2026

(54) GAS INJECTION APPARATUS FOR LAYER DEPOSITION

(71) Applicant: HANWHA PRECISION MACHINERY CO., LTD., Changwon-si (KR)

(72) Inventors: Sang Bo Kim, Seoul (KR); Su Woong Kim, Seoul (KR); Seung Dae Choi, Seoul (KR)

(73) Assignee: HANWHA PRECISION MACHINERY CO., LTD., Seoul (KR)

( * ) Notice: Subject to any disclaimer, the term of this patent is extended or adjusted under 35 U.S.C. 154(b) by 752 days.

(21) Appl. No.: 18/121,479

(22) Filed: Mar. 14, 2023

(65) Prior Publication Data

US 2023/0295806 A1 Sep. 21, 2023

(30) Foreign Application Priority Data

Mar. 15, 2022 (KR) ......................... 10-2022-0032189

(51) Int. Cl.
*C23C 16/455* (2006.01)
*C23C 16/52* (2006.01)

(52) U.S. Cl.
CPC .. *C23C 16/45565* (2013.01); *C23C 16/45514* (2013.01); *C23C 16/45561* (2013.01); *C23C 16/45591* (2013.01); *C23C 16/52* (2013.01)

(58) Field of Classification Search
CPC ........ C23C 16/45565; C23C 16/45514; C23C 16/45591; C23C 16/52; C23C 16/455; C23C 16/45561; H10P 72/0402
See application file for complete search history.

(56) References Cited

U.S. PATENT DOCUMENTS 6,121,579 A * 9/2000 Aoki ................... H10P 72/0436
219/390
9,466,468 B2 10/2016 Okayama et al.
(Continued)

FOREIGN PATENT DOCUMENTS

JP 2020138877 A * 9/2020
KR 10-2005-0102597 A 10/2005
(Continued)

OTHER PUBLICATIONS

Communication issued on May 8, 2024 by the Korean Intellectual Property Office for Korean Patent Application No. 10-2022-0032189.

*Primary Examiner* — Jeffrie R Lund
(74) *Attorney, Agent, or Firm* — Sughrue Mion, PLLC

(57) ABSTRACT

A gas injection apparatus includes a supply block including central gas ports configured to supply a process gas provided from a gas supply source; a diffusion cover under the supply block and including a branch duct which is connected to the central gas ports; a plurality of spray nozzles on a lower surface of the diffusion cover and connected to the branch duct, the plurality of spray nozzles configured to spray the process gas; and a shower head under the plurality of spray nozzles and including a plurality of spray holes vertically passing through the shower head, the plurality of spray holes configured to evenly spray the process gas sprayed by the plurality of spray nozzles. The diffusion cover further includes a concave portion at an upper surface thereof, the concave portion facing the central gas ports and concaved downward.

20 Claims, 17 Drawing Sheets

(56)     References Cited

U.S. PATENT DOCUMENTS

2011/0008955 A1 *    1/2011   Horii ....................... C23C 16/40
                                                                     118/704
2023/0295806 A1 *    9/2023   Kim ................. C23C 16/45565

FOREIGN PATENT DOCUMENTS

KR         10-0729874  B1      6/2007
KR         20140042699  A   *   4/2014    ............. H10P 72/04
KR         20150108780  A   *   9/2015    ....... C23C 16/45565
KR   10-2021-0054194  A       5/2021
TW             I683924  B   *   2/2020    ....... C23C 16/45587

* cited by examiner

GAS INJECTION APPARATUS FOR LAYER DEPOSITION

This application claims the benefit of Korean Patent Application No. 10-2022-0032189, filed on Mar. 15, 2022, in the Korean Intellectual Property Office, the disclosure of which is incorporated herein in its entirety by reference.

BACKGROUND

1. Field

Embodiments of the present disclosure relate to a substrate treatment apparatus for depositing, etching, and cleaning a thin layer on a substrate, and more particularly, to an assembly structure of a gas injection apparatus for spraying gas to a substrate.

2. Description of the Related Art

In general, atomic layer deposition (ALD) and chemical vapor deposition (CVD) are examples of a layer deposition method for depositing a thin layer by supplying a reaction gas to a substrate. ALD is a method of adsorbing and depositing a reaction gas on a substrate by alternately supplying and purging the reaction gas to and from the substrate, and CVD is a method of simultaneously spraying a reaction gas to deposit the reaction gas on a substrate.

An apparatus for performing the layer deposition method includes, for example, a process chamber having a heater member for mounting a semiconductor wafer (hereinafter, referred to as a wafer) and a gas injection apparatus facing the heater member and supplying a process gas toward a surface of the wafer. In the gas injection apparatus, a gas flow path may be formed so that a plurality of types of process gases are not mixed with each other and are horizontally diffused and evenly supplied to the surface of the wafer.

In addition, the gas injection apparatus is composed of multiple layers of metal parts, for example, metal parts stacked in three layers. These metal parts are fixed to each other with, for example, bolts and mounted in the process chamber. A process gas supplied from an upper side flows down a flow path penetrating through the three layers of metal parts and is evenly supplied to the entire surface of the wafer through a plurality of spray holes formed in a lower surface of the gas injection apparatus.

However, in a gas supply apparatus generally composed of multiple layers of parts, not much research has been conducted on the specific shape/structure of the parts to improve the flow quality or diffusion performance of a process gas passing through the parts.

SUMMARY

According to embodiments of the present disclosure, a specific shape/structure of a gas injection apparatus is provided which can secure improved flow characteristics and diffusion performance in a gas injection apparatus used in a layer deposition process.

According to embodiments of the present disclosure, a gas injection apparatus is provided. The gas injection apparatus includes: a supply block comprising central gas ports configured to supply a process gas provided from a gas supply source; a diffusion cover under the supply block, the diffusion cover comprising a branch duct that is connected to the central gas ports; a plurality of spray nozzles on a lower surface of the diffusion cover and connected to the branch duct, the plurality of spray nozzles configured to spray the process gas; and a shower head under the plurality of spray nozzles and comprising a plurality of spray holes vertically passing through the shower head, the plurality of spray holes configured to evenly spray the process gas sprayed by the plurality of spray nozzles, wherein the diffusion cover further includes a concave portion at an upper surface of the diffusion cover, the concave portion facing the central gas ports and concaved downward toward the lower surface of the diffusion cover, and wherein the concave portion includes a base area directly below the central gas ports, and extension areas extending in a radial direction of the diffusion cover from the base area.

According to one or more embodiments, the diffusion cover further includes a central nozzle mounting portion that is at a center of the lower surface of the diffusion cover, and wherein the base area includes a central supply hole that passes through a center of the base area and is connected to a spray nozzle, from among the plurality of spray nozzles, that is connected to the central nozzle mounting portion.

According to one or more embodiments, the diffusion cover further includes peripheral nozzle mounting portions that are around the central nozzle mounting portion, and the concave portion further includes peripheral supply holes that pass through opposite ends of the extension areas and are connected to the plurality of spray nozzles, from among the plurality of spray nozzles, that are connected to the peripheral nozzle mounting portions.

According to one or more embodiments, a ratio of a distance between the spray nozzle on the central nozzle mounting portion and any one of the plurality of spray nozzles on the peripheral nozzle mounting portions to a distance between the central supply hole and any one of the peripheral supply holes is between 1.5 and 1.9, non-inclusive.

According to one or more embodiments, each of the peripheral supply holes is in a bottom surface of the concave portion and at least one of sidewalls of the concave portion.

According to one or more embodiments, a ratio of a height of the peripheral supply holes in the sidewalls of the concave portion to a height of the sidewalls of the concave portion is between 0.3 and 0.7, non-inclusive.

According to one or more embodiments, a total number of central gas ports is two, and the base area has a symmetrical structure corresponding to the central gas ports.

According to one or more embodiments, in the base area, positions directly below the central gas ports are at least partially surrounded by sidewalls of the concave portion and do not include any supply holes that are connected to the plurality of spray nozzles.

According to one or more embodiments, the concave portion further includes first inclined surfaces that connect a bottom surface of the concave portion to the sidewalls of the concave portion in a first horizontal direction in which the central gas ports are arranged from each other.

According to one or more embodiments, the concave portion further includes second inclined surfaces that connect the bottom surface of the concave portion and the sidewalls of the concave portion in a second horizontal direction perpendicular to the first horizontal direction.

According to one or more embodiments, a ratio of an area of a horizontal cross-section of the concave portion to a total area of a horizontal cross-section of all of the central gas ports is between 28 and 35, non-inclusive.

According to one or more embodiments, the supply block is fixed to the diffusion cover and the diffusion cover is fixed to the shower head by at least one screw.

According to one or more embodiments, the plurality of spray nozzles are fixed to the lower surface of the diffusion cover by at least one screw.

According to one or more embodiments, a cavity is between the lower surface of the diffusion cover and an upper surface of the shower head, and the cavity is directly above all of the plurality of spray holes of the shower head.

According to one or more embodiments, the supply block is diffusion bonded to the diffusion cover.

According to one or more embodiments, the diffusion cover is diffusion bonded to the shower head.

According to embodiments of the present disclosure, a method of manufacturing a gas injection apparatus is provided. The method includes: assembling together a supply block, a diffusion cover, a plurality of spray nozzles, and a shower head, wherein the supply block includes central gas ports configured to supply a process gas provided from a gas supply source. The assembling includes: providing the plurality of spray nozzles on a lower surface of the diffusion cover such as to be connected to a branch duct of the diffusion cover, the plurality of spray nozzles configured to spray the process gas; providing the diffusion cover under the supply block such that the branch duct of the diffusion cover connects to the central gas ports, and a concave portion at an upper surface of the diffusion cover faces the central gas ports, and a base area of the concave portion is directly below the central gas ports; and providing the shower head under the plurality of spray nozzles. The concave portion is concaved downward toward the lower surface of the diffusion cover and further includes extension areas extending in a radial direction of the diffusion cover from the base area. The shower head includes a plurality of spray holes that vertically pass through the shower head, the plurality of spray holes configured to evenly spray the process gas sprayed by the plurality of spray nozzles.

According to one or more embodiments, the diffusion cover further includes a central nozzle mounting portion that is at a center of the lower surface of the diffusion cover, and wherein the base area includes a central supply hole that passes through a center of the base area and is connected to a spray nozzle, from among the plurality of spray nozzles, that is connected to the central nozzle mounting portion.

According to one or more embodiments, the diffusion cover further includes peripheral nozzle mounting portions that are around the central nozzle mounting portion, and the concave portion further include peripheral supply holes that pass through opposite ends of the extension areas and are connected to the plurality of spray nozzles, from among the plurality of spray nozzles, that are connected to the peripheral nozzle mounting portions.

According to one or more embodiments, a ratio of a distance between the spray nozzle on the central nozzle mounting portion and any one of the plurality of spray nozzles on the peripheral nozzle mounting portions to a distance between the central supply hole and any one of the peripheral supply holes is between 1.5 and 1.9, non-inclusive.

However, aspects of embodiments of the present disclosure are not restricted to the aspect(s) described above. The above and other aspects of embodiments of the present disclosure will become more apparent to one of ordinary skill in the art to which the present disclosure pertains by referencing the detailed description of the present disclosure given below.

BRIEF DESCRIPTION OF DRAWINGS

Aspects of the present disclosure will become apparent and more readily appreciated from the following description of non-limiting example embodiments, taken in conjunction with the accompanying drawings in which:

FIG. 2A is a perspective view of a gas injection apparatus according to an embodiment of the present disclosure as viewed from a first direction:

FIG. 6A is a plan view showing an upper surface of a diffusion cover according to an embodiment of the present disclosure:

FIG. 7A is a plan view showing an upper surface of a shower head according to an embodiment of the present disclosure:

FIG. 7B is a bottom view showing a lower surface of the shower head:

DETAILED DESCRIPTION

Figure 1:
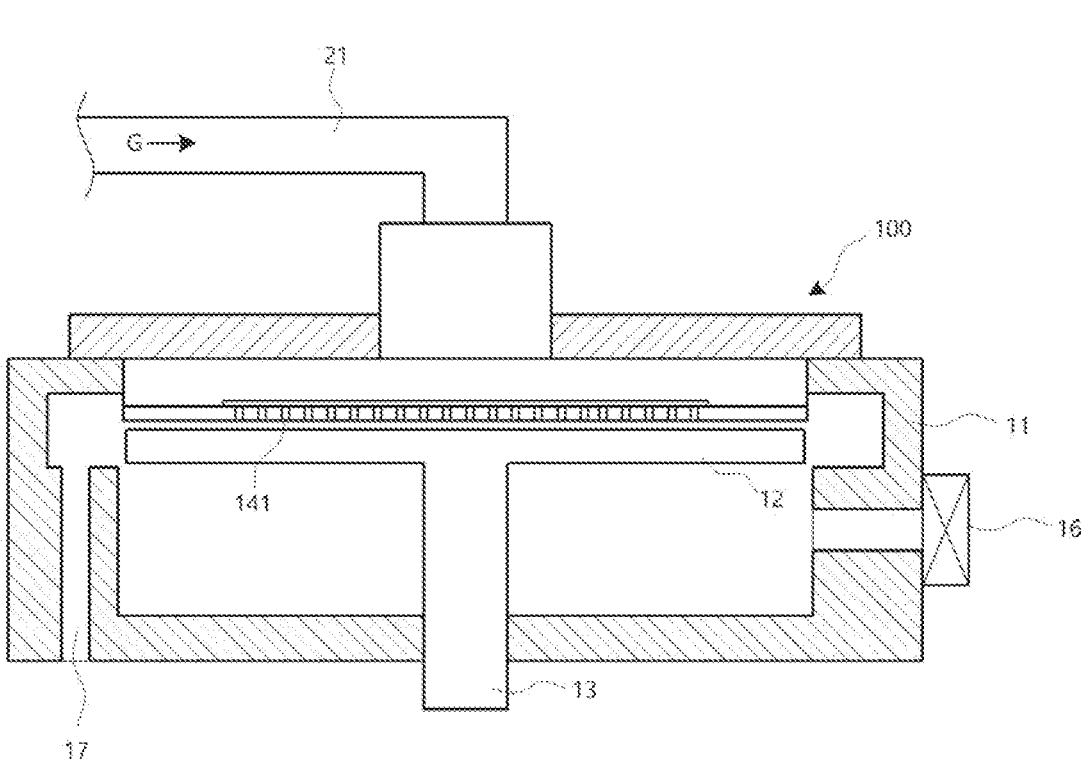
FIG. 1 is a longitudinal cross-sectional view of a layer deposition apparatus employing a gas supply apparatus according to an embodiment of the present disclosure.

Advantages and features of embodiments of the present disclosure and methods to achieve them will become apparent from the descriptions of non-limiting example embodiments herein below with reference to the accompanying drawings. However, the present disclosure is not limited to example embodiments disclosed herein and may be implemented in various ways. Description of the example embodiments is provided for making the disclosure of the present disclosure thorough and for fully conveying the scope of the present disclosure to those skilled in the art. Like reference numerals denote like elements throughout the descriptions.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Terms used herein are for describing the example embodiments rather than limiting the present disclosure. As used herein, the singular forms are intended to include plural forms as well, unless the context clearly indicates otherwise. Throughout this specification, the words "comprise" and "include" and variations such as "comprises," "comprising," "includes," and "including" will be understood to imply the inclusion of stated elements but not the exclusion of any other elements.

It will be understood that when an element or layer is referred to as being "on," "connected to," or "coupled to" another element or layer, it can be directly on, connected to, or coupled to the other element or layer or intervening elements or layers may be present. In contrast, when an element or layer is referred to as being "directly on," "directly connected to," or "directly coupled to" another element or layer, there are no intervening elements or layers present.

Hereinafter, non-limiting example embodiments of the present disclosure will be described in detail with reference to the accompanying drawings.

FIG. 1 is a longitudinal cross-sectional view of a layer deposition apparatus 200 employing a gas supply apparatus 100 according to embodiments of the present disclosure. The layer deposition apparatus 200 may include a chamber 11 that forms a process container made of, for example, aluminum. Inside the chamber 11, a heater member 12 and a support 13 are installed. The heater member 12 may have a disk-shape. The heater member 12 may be designed to mount a wafer (not shown), which is a substrate, and may be slightly larger than the wafer. The support 13 is disposed under the heater member 12 to support the heater member 12. A heater made of, for example, a resistance heating element may be embedded in the heater member 12. For example, the heater evenly heats the entire surface of the wafer during deposition.

The gas supply apparatus 100 is installed on an upper side of the chamber 11. The gas supply apparatus 100 will be described in more detail later with reference to subsequent drawings. The gas supply apparatus 100 is connected to a gas inlet pipe 21 that forms a gas supply path. At least one process gas G may be introduced into the gas inlet pipe 21.

A plurality of spray holes 141 are formed in a lower surface of the gas supply apparatus 100. A process gas G may be supplied to a surface of a wafer mounted on the heater member 12 through the spray holes 141.

A gate 16 through which a wafer is transferred is installed on a side of the chamber 11. A vertically movable lift pin (not shown) may be installed in the heater member 12 so that a transfer arm can transfer a wafer through the gate 16. In addition, an exhaust duct 17 may extend downward through a sidewall of the chamber 11. The gas remaining after the completion of the layer deposition process is discharged to the outside through the exhaust duct 17.

Figure 2A:
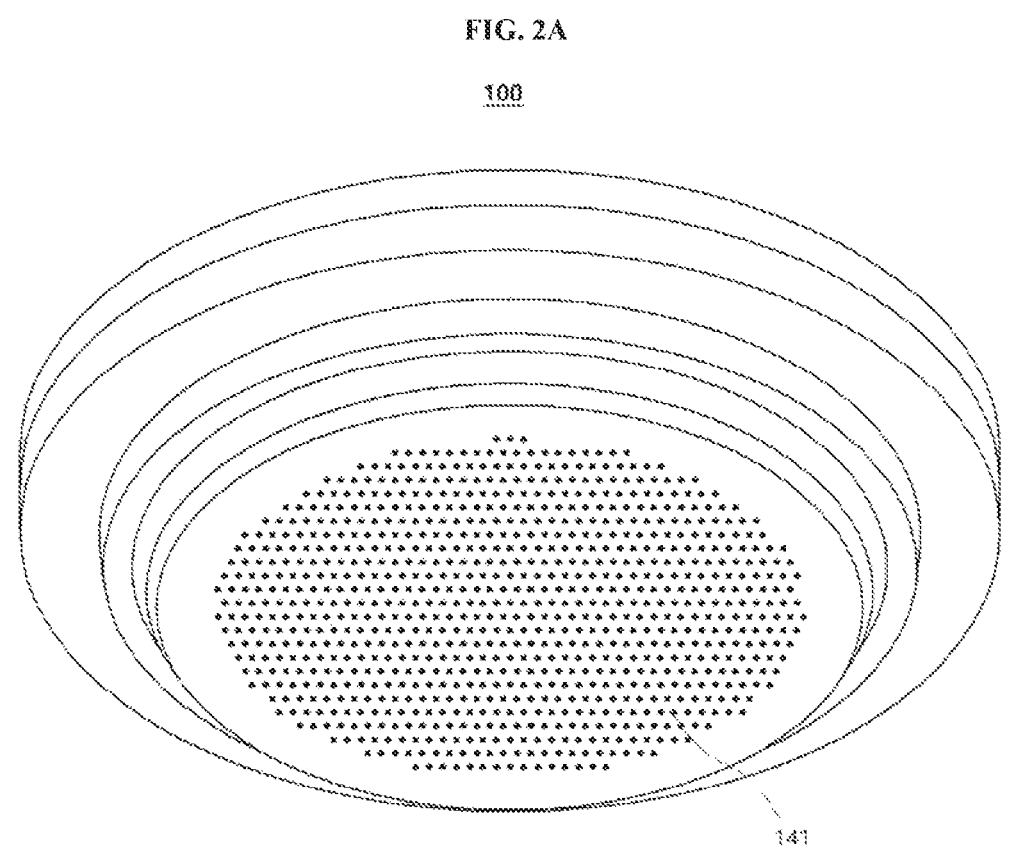
Figure 2B:
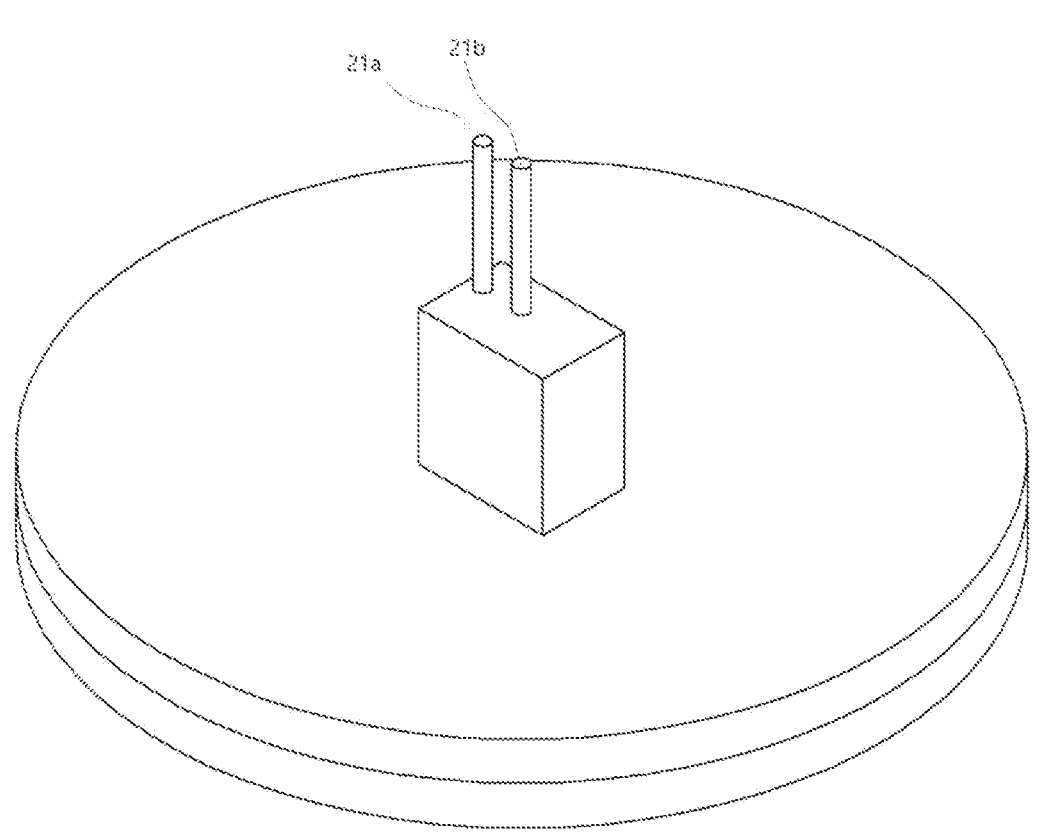
FIG. 2B is a perspective view of the gas injection apparatus according to the embodiment of the present disclosure as viewed from a second direction.
Figure 3A:
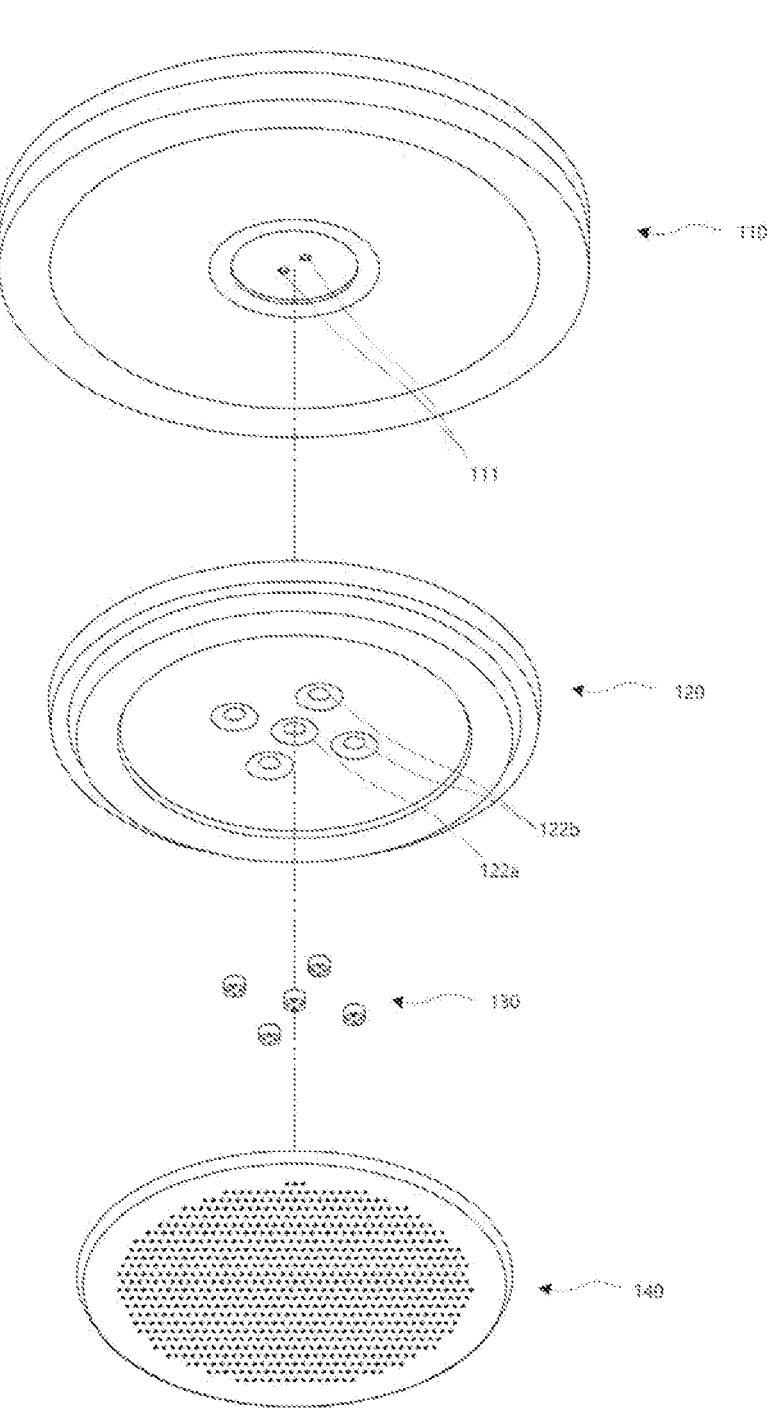
FIG. 3A is an exploded perspective view of the gas injection apparatus according to the embodiment of the present disclosure as viewed from a third direction.
Figure 3B:
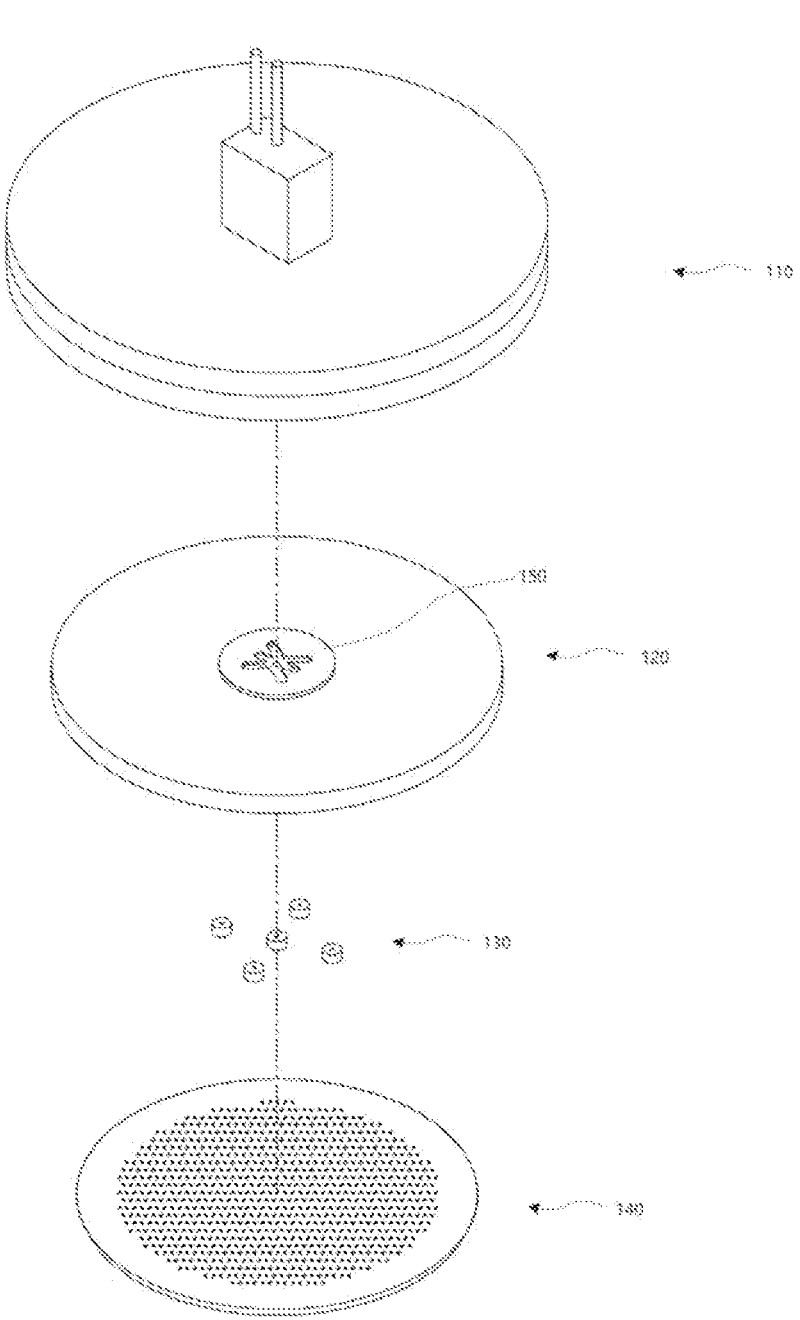
FIG. 3B is an exploded perspective view of the gas injection apparatus according to the embodiment of the present disclosure as viewed from a fourth direction.
Figure 4:
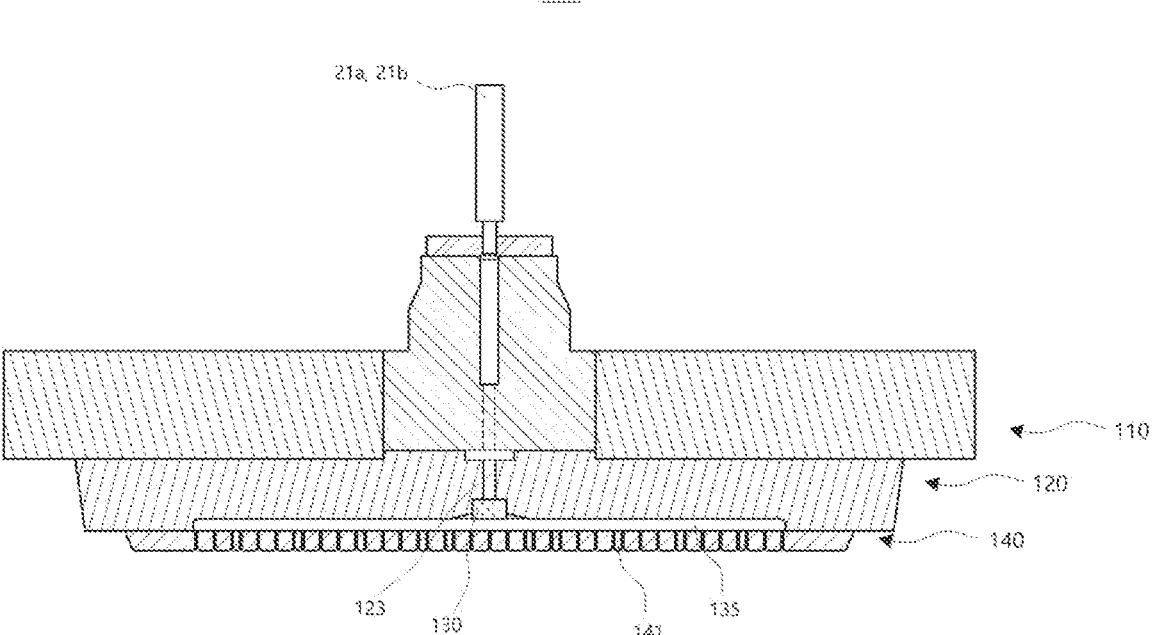
FIG. 4 is a longitudinal cross-sectional view of the gas injection apparatus according to the embodiment of the present disclosure, taken in a longitudinal direction.

FIGS. 2A and 2B are perspective views of a gas injection apparatus 100 according to an embodiment of the present disclosure as viewed from different directions. FIGS. 3A and 3B are exploded perspective views of the gas injection apparatus 100 according to the embodiment of the present disclosure as viewed from different directions. In addition, FIG. 4 is a longitudinal cross-sectional view of the gas injection apparatus 100 according to the embodiment of the present disclosure, taken in a longitudinal direction.

As shown in the drawings, the gas injection apparatus 100 may include a supply block 110, a diffusion cover 120, spray nozzles 130, and a shower head 140.

The supply block 110 has central gas ports 111 for supplying, in a downward direction, a process gas introduced from a gas supply source (not shown) through gas inlet pipes 21a and 21b. The number of central gas ports 111 may be two which is equal to the number of gas inlet pipes 21a and 21b. However, the present disclosure is not limited thereto, and the number of central gas ports 111 may also vary according to design intention.

The diffusion cover 120 is disposed under the supply block 110 and has at least one branch duct 123 (see FIG. 4) connected to the central gas ports 111. In FIG. 4, only one of the 5 exemplary branch ducts 123 is shown due to the sectional direction. The branch duct 123 passes through the diffusion cover 120 from top to bottom and slopes outward from the center of the diffusion cover 120. Therefore, nozzle holes formed in nozzle mounting portions 122b on a lower side of the diffusion cover 120 are located farther away from the center of the diffusion cover 120 than supply holes 52 (see FIG. 8) formed in a concave portion 150 on an upper side of the diffusion cover 120. Due to this configuration, the process gas passing through the diffusion cover 120 may be diffused and sprayed obliquely downward rather than directly downward.

The spray nozzles 130 are installed on a lower surface of the diffusion cover 120 and connected to the branch duct 123 to spray the process gas. In particular, the spray nozzles 130 may be installed on mounting portions 122a and 122b, which are concavely formed in a shape corresponding to the shape of the spray nozzles 130 on the lower surface of the diffusion cover 120, by fasteners such as screws. Alternatively, the spray nozzles 130 may be installed on an upper surface opposite the lower surface of the diffusion cover 120.

The shower head 140 is disposed under the spray nozzles 130 and includes a plurality of spray holes 141 vertically passing through the shower head 140 to evenly spray the process gas sprayed by the spray nozzles 130.

Here, as shown in FIG. 4, a plurality of screws (not shown) may be provided between the supply block 110 and the diffusion cover 120 and between the diffusion cover 120 and the shower head 140 to fasten and fix them to each other. In addition, a cavity 135 is formed between the lower surface of the diffusion cover 120 and an upper surface of the shower head 140. The cavity 135 has an area large enough to cover the entire area of the spray holes 141 of the shower head 140. For example, the cavity 135 may be directly above all of the spray holes 141 of the shower head 140.

Figure 5A:
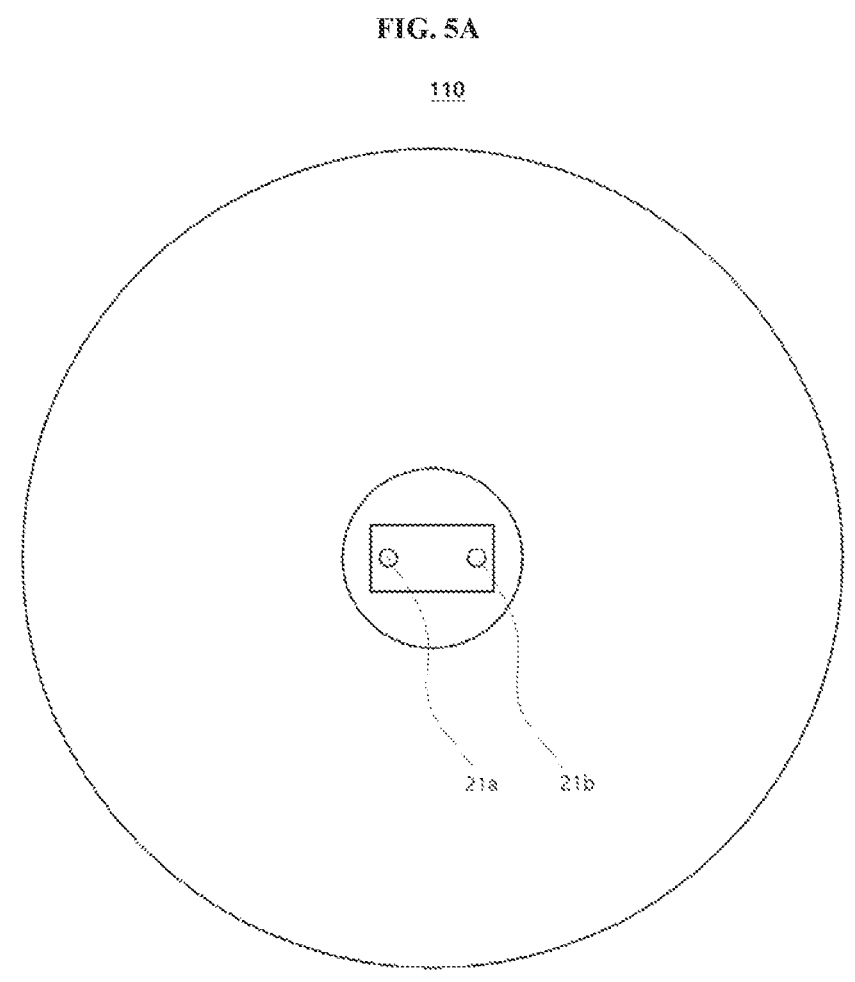
FIG. 5A is a plan view showing an upper surface of a supply block according to an embodiment of the present disclosure.
Figure 5B:
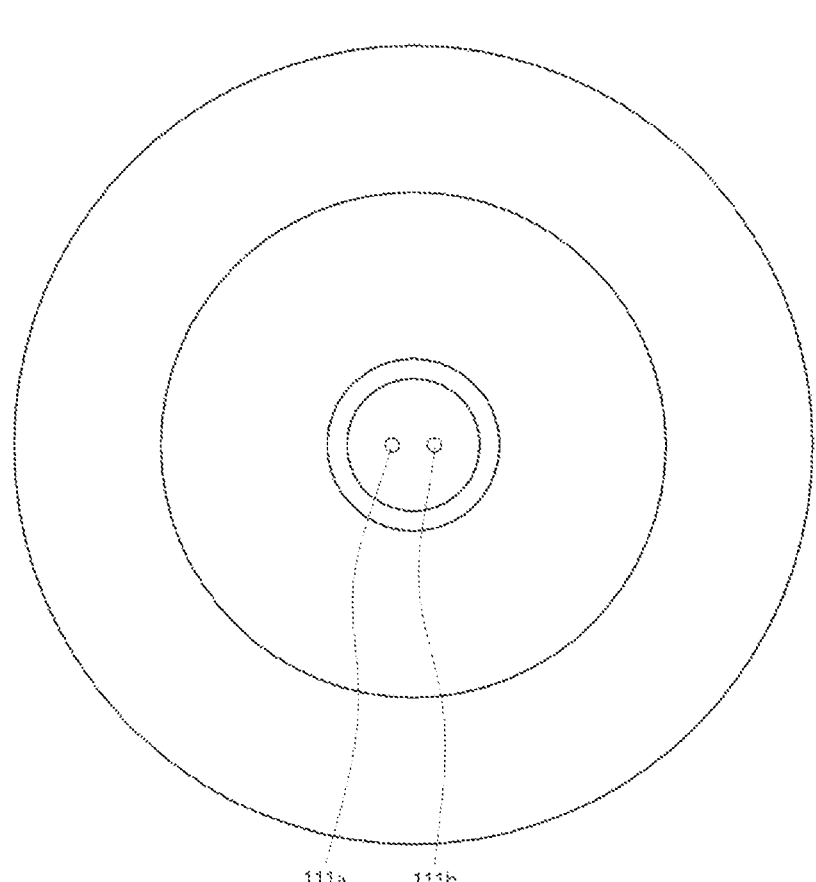
FIG. 5B is a bottom view showing a lower surface of the supply block.

FIG. 5A is a plan view showing an upper surface of a supply block 110 according to an embodiment of the present disclosure. FIG. 5B is a bottom view showing a lower surface of the supply block 110.

Two gas inlet pipes 21a and 21b are installed on the upper surface of the supply block 110, and two central gas ports 111a and 111b respectively connected to the gas inlet pipes 21a and 21b are formed on the lower surface of the supply block 110. Different process gases may be introduced through the two gas inlet pipes 21a and 21b. Accordingly, the different process gases may be supplied through the central gas ports 111a and 111b, respectively. However, embodiments of the present disclosure are not limited thereto, and the two gas inlet pipes 21a and 21b and the two central gas ports 111a and 111b may also supply the same type of process gas.

Figure 6A:
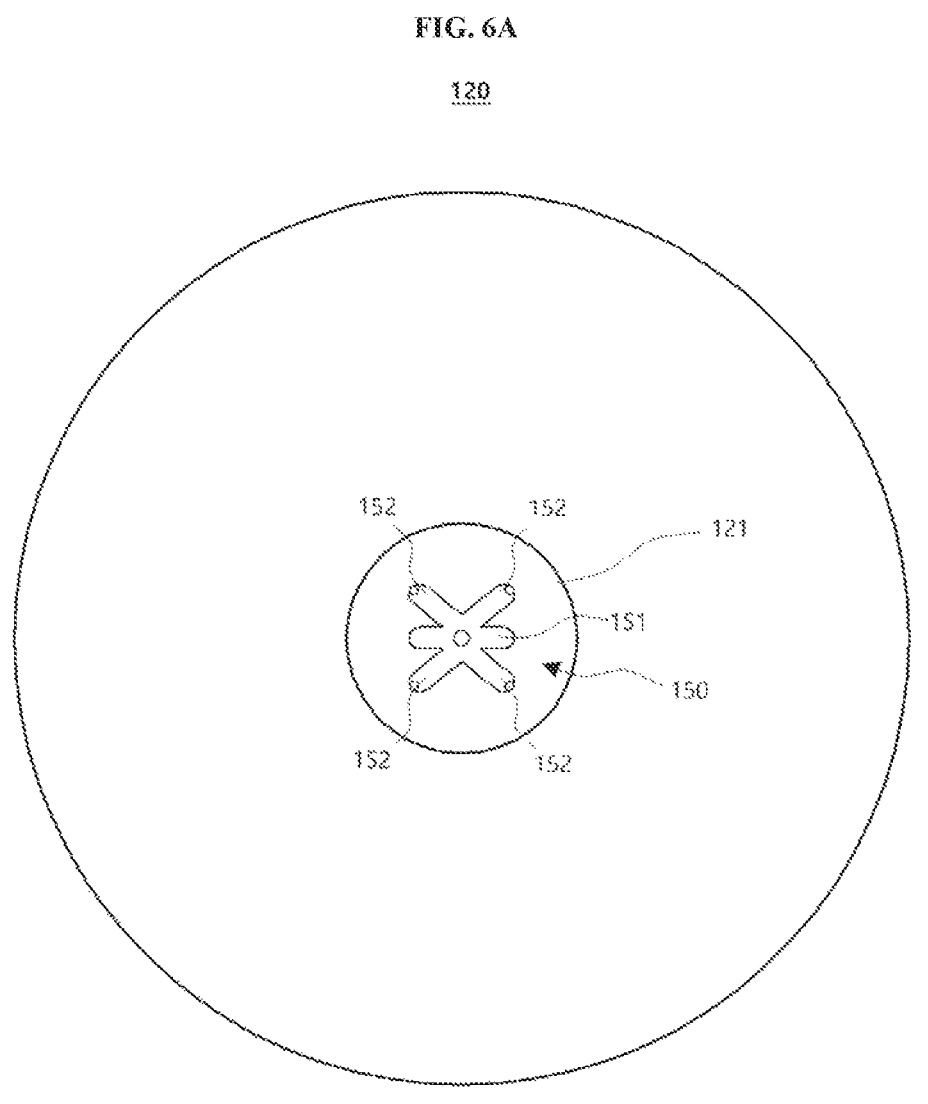
Figure 6B:
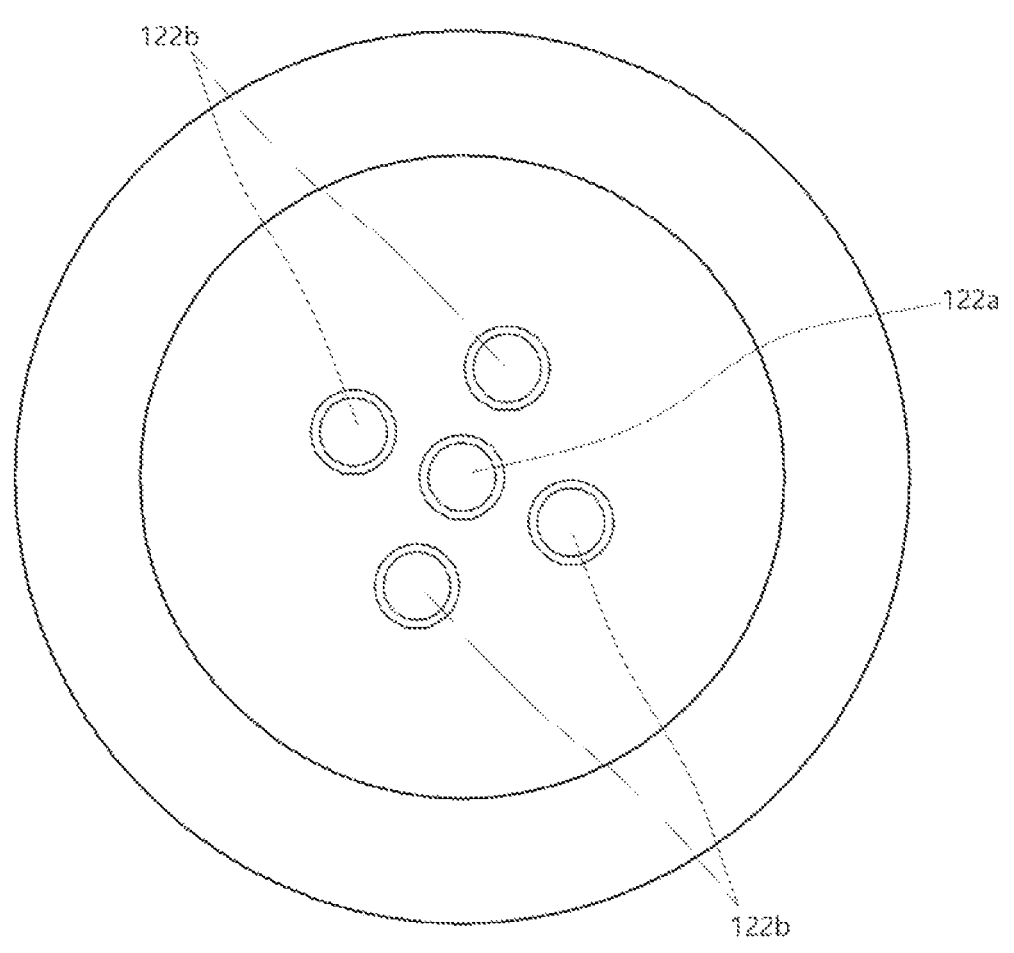
FIG. 6B is a bottom view showing a lower surface of the diffusion cover.

FIG. 6A is a plan view showing an upper surface of a diffusion cover 120 according to an embodiment of the present disclosure. FIG. 6B is a bottom view showing a lower surface of the diffusion cover 120.

A matching portion 121 is formed at a center of the upper surface of the diffusion cover 120 so that it can be fitly coupled to the central gas ports 111a and 111b. In addition, a concave portion 150 facing the central gas ports 111a and 111b and that is concaved downward from the upper surface of the diffusion cover 120 is formed inside the matching portion 121. The concave portion 150 includes a base area 151, covering the central gas ports 111a and 111b, and extension areas 152 extending in a radial direction from the base area 151.

A plurality of nozzle mounting portions (e.g., a central nozzle mounting portion 122a and peripheral nozzle mounting portions 122b) are disposed on the lower surface of the diffusion cover 120 to correspond to the concave portion 150. The nozzle mounting portions may include, for example, one central nozzle mounting portion 122a formed at a center of the lower surface of the diffusion cover 120, and a plurality of peripheral nozzle mounting portions 122b formed around the central nozzle mounting portion 122a at regular intervals in a circumferential direction. The number of peripheral nozzle mounting portions 122b may vary according to the number of supply holes (e.g., supply holes 51 and 52 in FIG. 8) formed in the concave portion 150. However, a case where the number of peripheral nozzle mounting portions 122b is five will be described with respect to an example embodiment of the present disclosure.

Figure 7A:
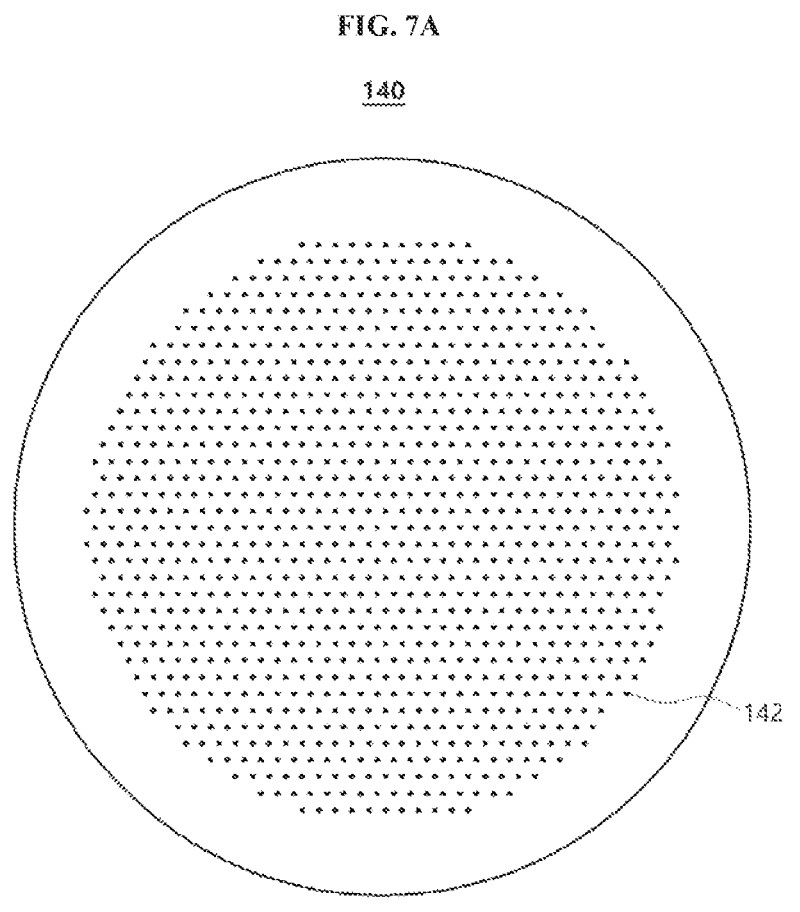
Figure 7B:
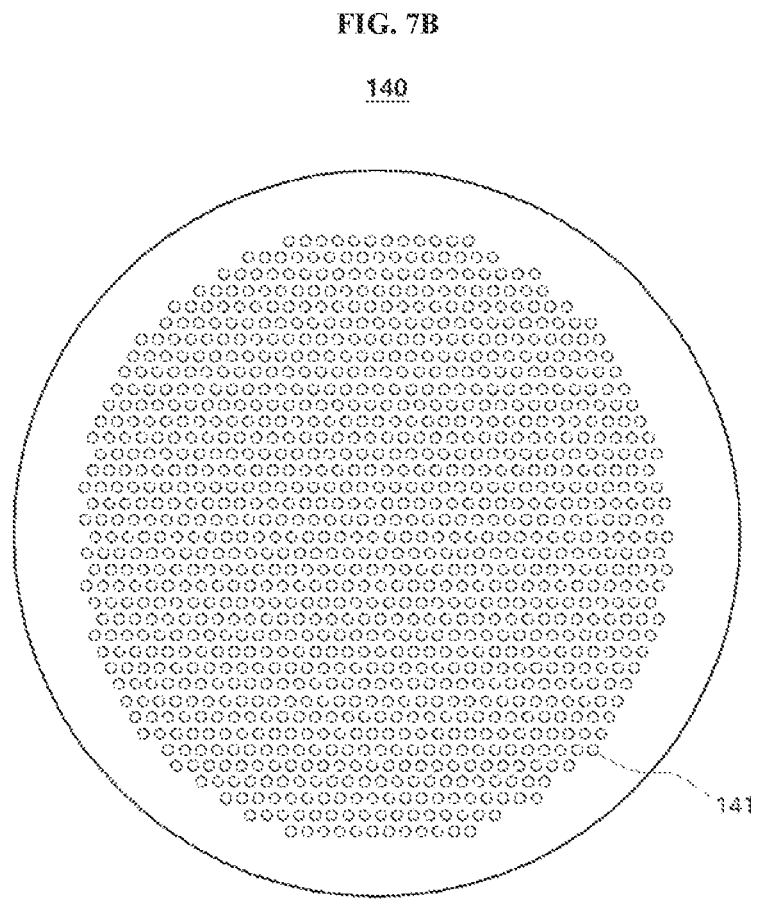

FIG. 7A is a plan view showing an upper surface of a shower head 140 according to an embodiment of the present disclosure. FIG. 7B is a bottom view showing a lower surface of the shower head 140. A plurality of spray holes 141 are formed in the lower surface of the shower head 140 to finally spray a process gas onto a wafer. Accordingly, a number of fine holes 142 corresponding to the number of spray holes 141 are formed in the upper surface of the shower head 140. According to embodiments, the fine holes 142 may be flared downward. In this case, the spray holes 141 may have a slightly larger diameter than the fine holes 142.

Figure 8:
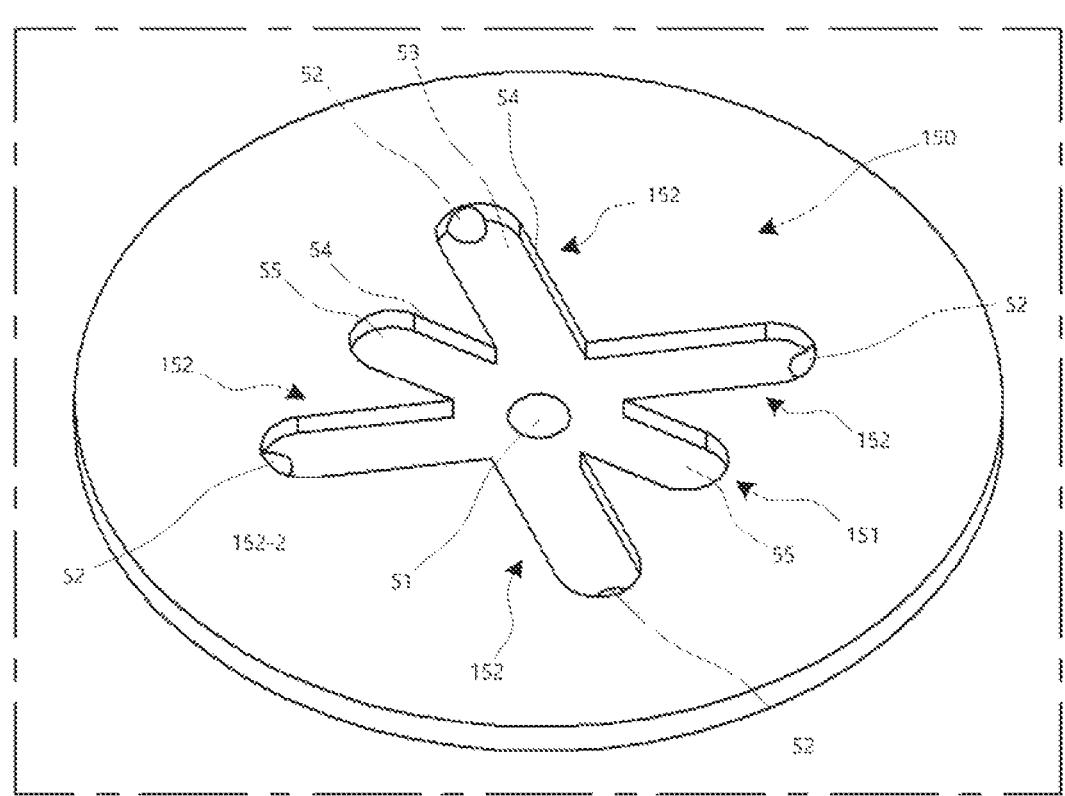
FIG. 8 is a perspective view showing a matching portion including a concave portion in the diffusion cover according to the embodiment of the present disclosure.

FIG. 8 is a perspective view showing only the matching portion 121 including the concave portion 150 in the diffusion cover 120 according to the embodiment of the present disclosure.

As described above, the concave portion 150 includes the base area 151 covering two central gas ports 111a and 111b and, for example, four extension areas 152 extending in the radial direction from the base area 151.

The base area 151 has a symmetrical structure (a mirror symmetrical structure) corresponding to the two central gas ports 111a and 111b formed in the supply block 110 described above. In particular, in the base area 151, positions 55 facing (e.g., directly below) the two central gas ports 111a and 111b are at least partially surrounded by sidewalls 54 and do not include any supply holes that are connected to the spray nozzles. This is because, if the two central gas ports 111a and 111b are located close to supply holes (e.g., a central supply hole 51 and peripheral supply holes 52), a process gas is discharged by the spray nozzles 130 before being diffused by the diffusion cover 120. Therefore, in order to improve a diffusion function or a uniform spray function, the supply holes may be disposed at positions quite far away from the positions 55 corresponding to the central gas ports 111a and 111b. For example, at the positions 55, the base area 151 may be configured to block the process gas supplied from the two central gas ports 111a and 111b from passing through the concave portion 150 in the downward direction. For example, at the positions 55, a bottom surface (e.g., bottom surface 53) of the base area 151 does not include any of the supply holes and may be at least partially surrounded by the sidewalls 54 such that the process gas supplied to the positions 55 from the two central gas portions 111a and 111b move towards supply holes in other portions (e.g., a center of the base area 151 and/or the extension areas 152) due to a configuration of the concave portion 55 (e.g., the sidewalls 54 and the bottom surface 53).

In an embodiment, a central supply hole 51 is formed to pass through a center of the base area 151 and is connected to a spray nozzle 130 mounted on the central nozzle mounting portion 122a among the spray nozzles 130 mounted on the lower surface of the diffusion cover 120.

Similarly, peripheral supply holes 52 (e.g., four peripheral supply holes 52 in the embodiment of FIG. 8) are formed to pass through ends of the extension areas 152 and are connected to spray nozzles 130 mounted on the peripheral nozzle mounting portions 122b. In one embodiment of the present disclosure, a single branch duct (123 in FIG. 4) begins at either of the supply holes 51 or 52 located on the top surface of the diffusion cover 120 and extends to the corresponding nozzle mounting portion 122a or 122b located on the bottom surface of the diffusion cover 120. A single spray nozzle 130 is installed on each of these nozzle mounting portions 122a and 122b.

Here, each of the peripheral supply holes 52 is formed in a bottom surface 53 of the concave portion 150 and a sidewall 54 of the concave portion 150. If the peripheral supply holes 52 are formed in both the bottom surface 53 and the sidewalls 54 instead of only on the bottom surface 53 or on the sidewalls 54, flow characteristics of a fluid such as a process gas can be improved.

Figure 9A:
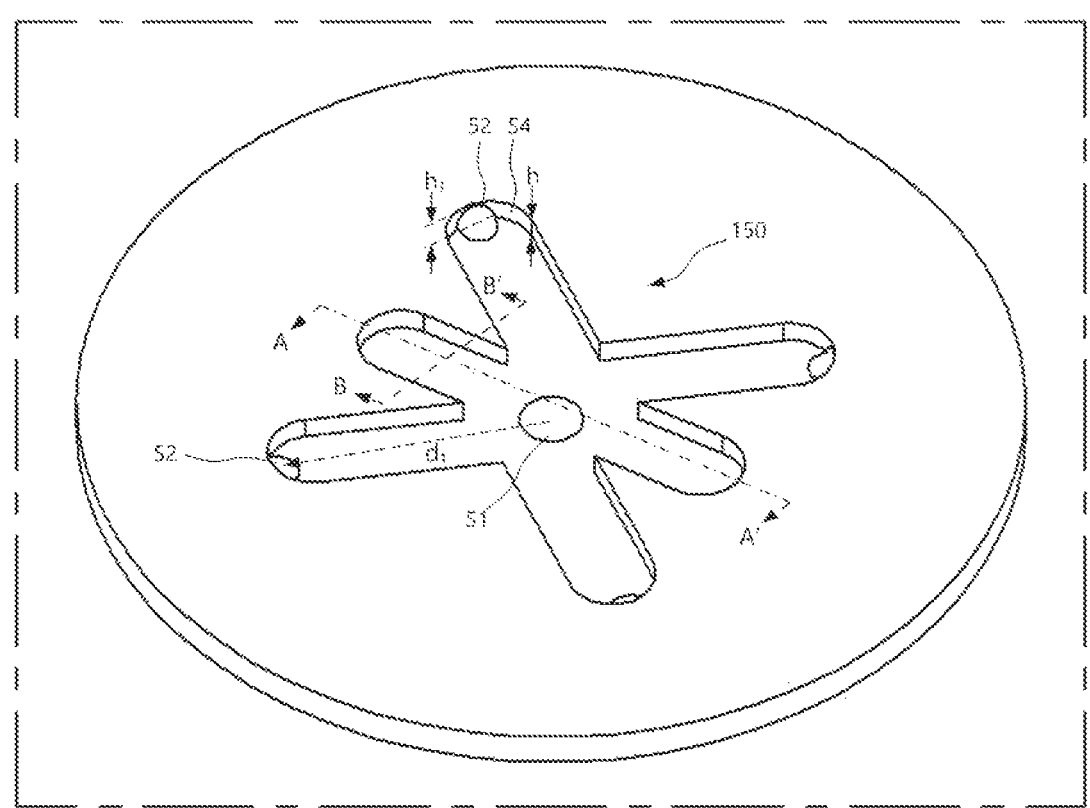
FIG. 9A is a perspective view showing example parameters in the concave portion shown in FIG. 8.
Figure 9B:
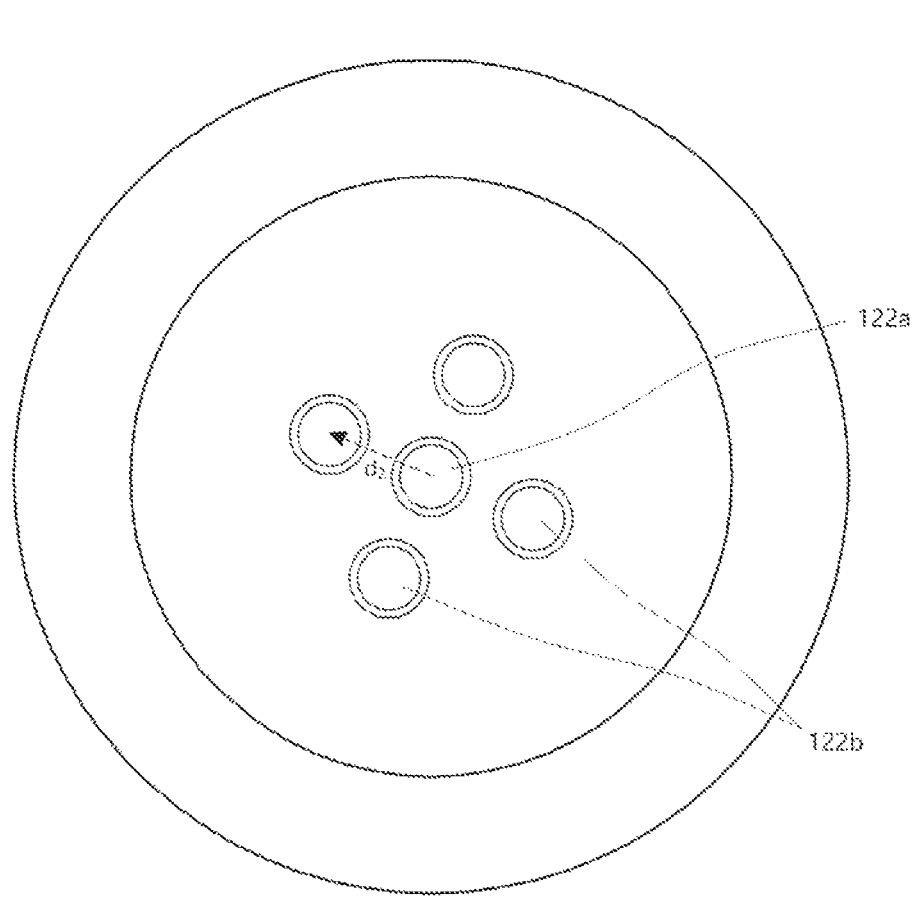
FIG. 9B is a perspective view showing example parameters in a plurality of nozzle mounting portions formed on the lower surface of the diffusion cover.

FIG. 9A is a perspective view showing example parameters in the concave portion 150 shown in FIG. 8. FIG. 9B is a perspective view showing example parameters in the nozzle mounting portions 122a and 122b formed on the lower surface of the diffusion cover 120.

In FIG. 9A, a distance d1 may be between the central supply hole 51 and any one of the peripheral supply holes 52. The central supply hole 51 is located at the same distance d1 from any of the four peripheral supply holes 52. In addition, the sidewalls 54 of the concave portion 150 may have a height h, and the peripheral supply holes 52 in the sidewalls 54 of the concave portion 150 may have a height h1.

In FIG. 9B, a distance d2 may be between the spray nozzle 130 mounted on the central nozzle mounting portion 122a and any one of the spray nozzles 130 mounted on the peripheral nozzle mounting portions 122b.

A ratio of the distance d1 and distance d2 closely affects the process gas diffusion performance of the diffusion cover 120. In particular, the ratio of the distance d2 to distance d1 may be greater than 1 so that a process gas can be diffused as it passes through the diffusion cover 120. Specifically, the ratio of the distance d2 to distance d1 may be between 1.5 and 1.9, non-inclusive, optimally, about 1.7. This numerical range results from the fact that the ratio (distance $d2$/distance $d1$) may degrade the diffusion performance when smaller than a lower limit (e.g., 1.5) and may excessively reduce the flow rate of the gas supplied from the gas supply apparatus 100 onto a wafer when greater than an upper limit (e.g., 1.9). If the distance $d2$ is maintained at an appropriately large length, even if the size of the shower head 140 is slightly increased, uniform gas supply is possible from the entire area of the shower head 140.

A ratio of the height $h1$ to the height $h$ also affects the characteristics or flow rate of the process gas passing through the diffusion cover 120. Specifically, the ratio of the height $h1$ to the height $h$ may be between 0.3 and 0.7, non-inclusive. This numerical range results from the fact that the ratio (the height $h1$/the height $h$) may degrade the diffusion performance when smaller than a lower limit (e.g., 0.3) and may excessively reduce the flow rate of the gas supplied from the gas supply apparatus 100 onto a wafer when larger than an upper limit (e.g., 0.7). If the height $h1$ is maintained at an appropriate height, the overall flow quality of the process gas can be improved.

Important design variables such as diffusion performance and flow quality may also be affected by the size of the central gas ports 111$a$ and 111$b$ and the area of the concave portion 150. In FIG. 5B, the total area (herein referred to as S1) of the two central gas ports 111$a$ and 111$b$ can be simply calculated using only the diameters of the central gas ports 111$a$ and 111$b$. In addition, the area (herein referred to as S2) of the concave portion 150 can be grasped by calculating the area of a closed curve occupied by the concave portion 150 in FIG. 6A. Specifically, a ratio of S2 to S1 may be between 28 and 35, non-inclusive, optimally, about 31. The ratio (S2/S1) smaller than a lower limit of 28 or greater than an upper limit of 35 may cause a reduction in flow quality between the supply block 110 and the diffusion cover 120. According to embodiments, the area (S2) of the concave portion 150 may refer to an area of a horizontal cross-section of the concave portion 150, and the area (S1) of the two central gas ports 11$a$ and 11$b$ may refer to an area of a horizontal cross-section of the two central gas ports 11$a$ and 11$b$.

Figure 10A:
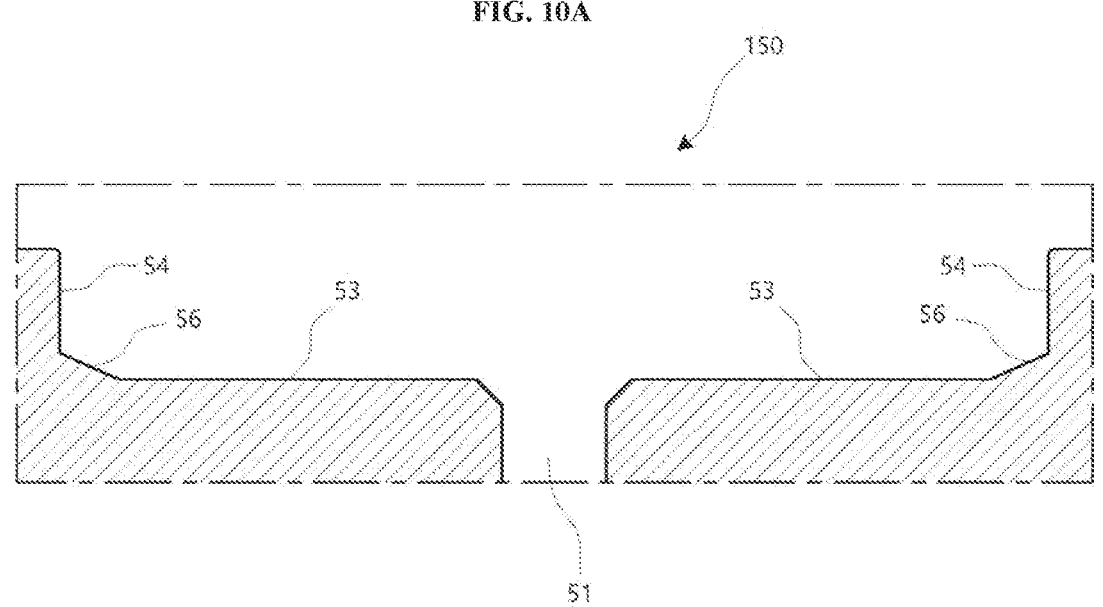
FIG. 10A is a longitudinal cross-sectional view of the concave portion taken in a direction A-A' of FIG. 9A.
Figure 10B:
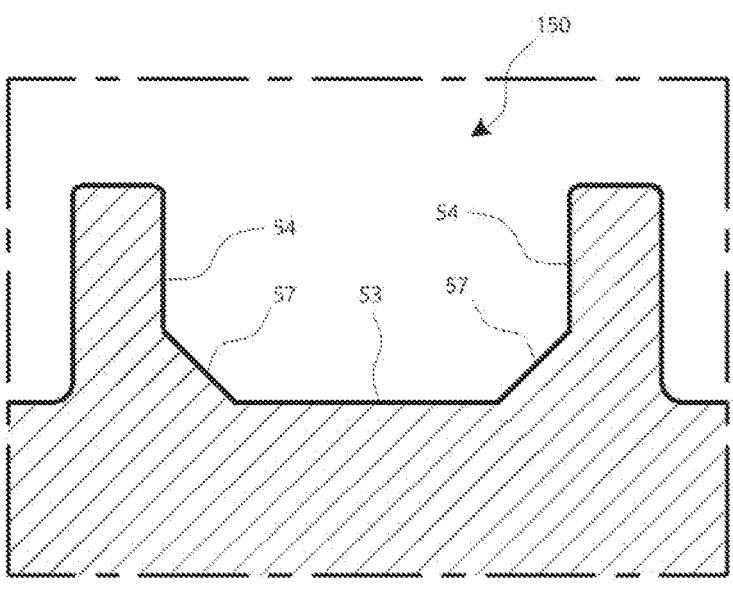
FIG. 10B is a longitudinal cross-sectional view of the concave portion taken in a direction B-B' of FIG. 9A.

FIG. 10A is a longitudinal cross-sectional view of the concave portion 150 taken in a direction A-A' of FIG. 9A. FIG. 10B is a longitudinal cross-sectional view of the concave portion 150 taken in a direction B-B' of FIG. 9A.

According to embodiments, the bottom surface 53 of the concave portion 150 may be perpendicular to the sidewalls 54 of the concave portion 150 in the direction A-A' connecting the two central gas ports 111$a$ and 111$b$. Alternatively, referring to FIG. 10A, the concave portion 150 has first inclined surfaces 56 connecting the bottom surface 53 of the concave portion 150 and the sidewalls 54 of the concave portion 150 in the direction A-A' connecting the two central gas ports 111$a$ and 111$b$.

Figure 11:
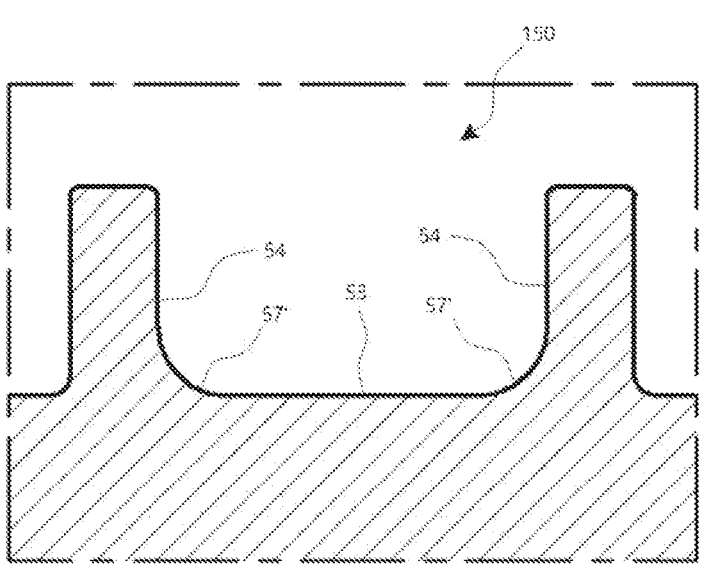
FIG. 11 is a longitudinal cross-sectional view showing a modified example in which rounded inclined surfaces are applied to the concave portion shown in FIG. 10B.

In addition, the bottom surface 53 of the concave portion 150 may be perpendicular to the sidewalls 54 of the concave portion 150 in the direction B-B' perpendicular to the direction A-A' connecting the two central gas ports 111$a$ and 111$b$. Alternatively, referring to FIG. 10B, the concave portion 150 has second inclined surfaces 57 connecting the bottom surface 53 of the concave portion 150 and the sidewalls 54 of the concave portion 150 in the direction B-B' perpendicular to the direction A-A' connecting the two central gas ports 111$a$ and 111$b$. The first inclined surfaces 56 and/or the second inclined surfaces 57 facilitate the overall gas flow by reducing vortex or flow stagnation near corners when a process gas is supplied from above. However, embodiments of the present disclosure are not limited to including the first inclined surfaces 56 and the second inclined surfaces 57, which may be linear inclined surfaces. In an embodiment, rounded inclined surfaces 57' may be applied as shown in FIG. 11 to further increase the above effect. For example, the first inclined surfaces 56 and/or the second inclined surfaces 57 may be the rounded inclined surfaces 57".

In the above embodiments, a plurality of screws are provided between the supply block 110 and the diffusion cover 120 and between the diffusion cover 120 and the shower head 140 to fasten them to each other as shown in FIG. 4. However, when layers of parts constituting the gas injection apparatus 100 are fastened together with the screws, there is a risk that the screws will be loosened in case of bolting torque and temperature rise. In addition, there is a risk that pieces coming off the screws during screwing or during use after the screwing will block some through holes.

In order to solve these problems, the layers of parts may be integrally joined by diffusion bonding instead of the screws. The diffusion bonding is a technique of brining metal materials into close contact with each other at high temperature and bonding them together using diffusion of atoms generated between bonding surfaces. In particular, the diffusion bonding has various advantages such as little thermal stress or deformation after bonding, little material deterioration due to structural change, the capability to bond similar materials (e.g., metals) as well as dissimilar materials (e.g., ceramics and metals) with different properties, and the capability to bond complex shapes. However, once bonding is finished, it may not be possible to know the state of bonded surfaces without a cutting process.

At least one pair of layers of parts belonging to the gas injection apparatus 100 according to an embodiment of the present disclosure may be joined by diffusion bonding (see FIGS. 3A and 3B). For example, the supply block 110 and the diffusion cover 120 may be joined by diffusion bonding. While the supply block 110 and the diffusion cover 120 are joined by diffusion bonding, the diffusion cover 120 and the shower head 140 may be joined by screws as described above. In this case, since the supply block 110 and the diffusion cover 120 are integrated by diffusion bonding, airtightness and fastening can be secured. On the other hand, since the diffusion cover 120 and the shower head 140 can be separated, a problem at a boundary surface between them can be managed and repaired.

However, embodiments of the present disclosure are not limited thereto. When airtightness/fastening is more important than the need for management/maintenance, the diffusion cover 120 and the shower head 140 may also be joined by diffusion bonding.

In a gas injection apparatus used in a layer deposition process according to embodiments of the present disclosure, both flow characteristics and diffusion performance of a fluid used in the gas injection apparatus can be improved.

In a gas injection apparatus used in a layer deposition process according to embodiments of the present disclosure, even if the size of a shower head is increased, uniform gas supply from the entire area of the shower head is possible.

However, the effects of embodiments of the present disclosure are not restricted to the ones described herein. The above and other effects of embodiments of the present disclosure will become more apparent to one of daily skill in the art to which the present disclosure pertains by referencing the above description and the claims.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific example embodiments describe herein, and that modifications and other embodiments are intended to be included within the scope of the present disclosure.

What is claimed is:

1. A gas injection apparatus comprising:
a supply block comprising central gas ports configured to supply a process gas provided from a gas supply source:
a diffusion cover under the supply block, the diffusion cover comprising a branch duct that is connected to the central gas ports:
a plurality of spray nozzles on a lower surface of the diffusion cover and connected to the branch duct, the plurality of spray nozzles configured to spray the process gas; and
a shower head under the plurality of spray nozzles and comprising a plurality of spray holes vertically passing through the shower head, the plurality of spray holes configured to evenly spray the process gas sprayed by the plurality of spray nozzles,
wherein the diffusion cover further comprises a concave portion at an upper surface of the diffusion cover, the concave portion facing the central gas ports and concaved downward toward the lower surface of the diffusion cover, and
wherein the concave portion comprises a base area directly below the central gas ports, and extension areas extending in a radial direction of the diffusion cover from the base area.

2. The gas injection apparatus of claim 1, wherein the diffusion cover further comprises a central nozzle mounting portion that is at a center of the lower surface of the diffusion cover, and
wherein the base area comprises a central supply hole that passes through a center of the base area and is connected to a spray nozzle, from among the plurality of spray nozzles, that is connected to the central nozzle mounting portion.

3. The gas injection apparatus of claim 2, wherein the diffusion cover further comprises peripheral nozzle mounting portions that are around the central nozzle mounting portion, and
wherein the concave portion further comprises peripheral supply holes that pass through opposite ends of the extension areas and are connected to the plurality of spray nozzles, from among the plurality of spray nozzles, that are connected to the peripheral nozzle mounting portions.

4. The gas injection apparatus of claim 3, wherein a ratio of a distance between the spray nozzle on the central nozzle mounting portion and any one of the plurality of spray nozzles on the peripheral nozzle mounting portions to a distance between the central supply hole and any one of the peripheral supply holes is between 1.5 and 1.9, non-inclusive.

5. The gas injection apparatus of claim 3, wherein each of the peripheral supply holes is in a bottom surface of the concave portion and at least one of sidewalls of the concave portion.

6. The gas injection apparatus of claim 5, wherein a ratio of a height of the peripheral supply holes in the sidewalls of the concave portion to a height of the sidewalls of the concave portion is between 0.3 and 0.7, non-inclusive.

7. The gas injection apparatus of claim 1, wherein a total number of central gas ports is two, and the base area has a symmetrical structure corresponding to the central gas ports.

8. The gas injection apparatus of claim 7, wherein in the base area, positions directly below the central gas ports are at least partially surrounded by sidewalls of the concave portion and do not include any supply holes that are connected to the plurality of spray nozzles.

9. The gas injection apparatus of claim 8, wherein the concave portion further comprises first inclined surfaces that connect a bottom surface of the concave portion to the sidewalls of the concave portion in a first horizontal direction in which the central gas ports are arranged from each other.

10. The gas injection apparatus of claim 9, wherein the concave portion further comprises second inclined surfaces that connect the bottom surface of the concave portion and the sidewalls of the concave portion in a second horizontal direction perpendicular to the first horizontal direction.

11. The gas injection apparatus of claim 8, wherein a ratio of an area of a horizontal cross-section of the concave portion to a total area of a horizontal cross-section of all of the central gas ports is between 28 and 35, non-inclusive.

12. The gas injection apparatus of claim 1, wherein the supply block is fixed to the diffusion cover and the diffusion cover is fixed to the shower head by at least one screw.

13. The gas injection apparatus of claim 1, wherein the plurality of spray nozzles are fixed to the lower surface of the diffusion cover by at least one screw.

14. The gas injection apparatus of claim 1, wherein a cavity is between the lower surface of the diffusion cover and an upper surface of the shower head, and the cavity is directly above all of the plurality of spray holes of the shower head.

15. The gas injection apparatus of claim 1, wherein the supply block is diffusion bonded to the diffusion cover.

16. The gas injection apparatus of claim 15, wherein the diffusion cover is diffusion bonded to the shower head.

17. A method of manufacturing a gas injection apparatus, the method comprising:
assembling together a supply block, a diffusion cover, a plurality of spray nozzles, and a shower head,
wherein the supply block includes central gas ports configured to supply a process gas provided from a gas supply source,
wherein the assembling comprises:
providing the plurality of spray nozzles on a lower surface of the diffusion cover such as to be connected to a branch duct of the diffusion cover, the plurality of spray nozzles configured to spray the process gas;
providing the diffusion cover under the supply block such that:
the branch duct of the diffusion cover connects to the central gas ports, and
a concave portion at an upper surface of the diffusion cover faces the central gas ports, and a base area of the concave portion is directly below the central gas ports; and
providing the shower head under the plurality of spray nozzles,
wherein the concave portion is concaved downward toward the lower surface of the diffusion cover and further includes extension areas extending in a radial direction of the diffusion cover from the base area, and wherein the shower head includes a plurality of spray holes that vertically pass through the shower head, the plurality of spray holes configured to evenly spray the process gas sprayed by the plurality of spray nozzles.

18. The method of claim 17, wherein the diffusion cover further includes a central nozzle mounting portion that is at a center of the lower surface of the diffusion cover, and wherein the base area includes a central supply hole that passes through a center of the base area and is connected to a spray nozzle, from among the plurality of spray nozzles, that is connected to the central nozzle mounting portion.

19. The method of claim 18, wherein the diffusion cover further includes peripheral nozzle mounting portions that are around the central nozzle mounting portion, and the concave portion further include peripheral supply holes that pass through opposite ends of the extension areas and are connected to the plurality of spray nozzles, from among the plurality of spray nozzles, that are connected to the peripheral nozzle mounting portions.

20. The method of claim 19, wherein a ratio of a distance between the spray nozzle on the central nozzle mounting portion and any one of the plurality of spray nozzles on the peripheral nozzle mounting portions to a distance between the central supply hole and any one of the peripheral supply holes is between 1.5 and 1.9, non-inclusive.

* * * * *